PNPN SEMICONDUCTOR SWITCHING DEVICES WITH STABILIZED FIRING CHARACTERISTICS

Filed July 1, 1964

INVENTOR:
FINIS E. GENTRY,

BY Urban L. Jaulkion

HIS ATTORNEY.

United States Patent Office 3,284,681

Patented Nov. 8, 1966

3,284,681

PNPN SEMICONDUCTOR SWITCHING DEVICES WITH STABILIZED FIRING CHARACTERISTICS

Finis E. Gentry, Skaneateles, N.Y., assignor to General Electric Company, a corporation of New York Filed July 1, 1964, Ser. No. 379,656
8 Claims. (Cl. 317—235)

The present invention relates, in general, to semiconductor devices and, in particular, to improvements in semiconductor devices of the multi-layer type having switch-like characteristics.

Such devices are described in an article by Moll, Tanenbaum, Goldey and Holonyak in "Proceedings of the IRE," September 1956, volume 44, pages 1174–1182. One form of such currently available devices includes a pair of main current carrying electrodes and a control electrode. When connected in circuit, significant current conduction across the main electrodes is blocked until a small control current of suitable magnitude is applied to the control electrode.

Such form of device is composed of a body of silicon semiconductor material having four distinct layers with adjacent layers being of opposite conductivity type to form a plurality of P-N junctions and having a main electrical terminal connected to each of the outside layers. When one of the main terminals is biased in one polarity with respect to the other, the two P-N junctions nearest the terminals become reversely biased and the center P-N junction becomes forwardly biased; thus, a high impedance is presented between the terminals. If a sufficiently large potential is applied between the terminals, the two P-N junctions nearest the terminals break down and conduct current in the reverse direction.

When a voltage of the opposite polarity is applied between the main terminals, the two P-N junctions nearest the terminals become forwardly biased and the center P-N junction becomes reversely biased; thus, a high impedance is again presented between the terminals. However, if the potential applied between the terminals is increased, or if control current of suitable magnitude and direction is applied to one of the intermediate layers, eventually not only does the center P-N junction break down, but reverses in polarization and a very low impedance is presented between the terminals.

Two requirements which must be fulfilled in order to obtain the reversal in polarity of the center P-N junction and hence conduction are (1) that one of the two transistor sections into which the device is resolvable, an NPN and a PNP transistor section with the center junction being the collector junction of each of the transistor sections, have a current gain, $\alpha$, which increases with current, and (2) that the sum of the current gains of the two transistor sections be equal to or greater than unity at some intermediate current between high impedance and low impedance conditions. The variable current gain requirement is inherent in silicon P-N junction structures. Sufficient current is passed by the center junction as a result of leakage or avalanche effects to enable the second requirement to be met.

Desirable qualities in such devices are that they be relatively insensitive to ambient temperatures and heating in the device itself, particularly with respect to being able to withstand high temperatures without spontaneously triggering in the absence of a control current applied to the control electrode. Another desirable quality in such devices is that they have the capability of switching large currents in response to very small control current.

In devices such as described above, these two requirements are normally contradictory. Normally, as the capability for switching larger currents is enhanced, larger control currents are required for this purpose. It would be particularly desired to obtain control current sensitivity along with higher temperature stability. A series of devices are disclosed in copending patent application, Serial No. 838,504, Richard W. Aldrich and Nick Holonyak, Jr., filed September 8, 1959, and assigned to the assignee of the present invention, in which better temperature stability is obtained. However, in some of the devices disclosed in that patent application, some control current sensitivity has to be sacrificed over the sensitivity of conventional devices.

U.S. Patent 3,196,330, July 30, 1965, based upon copending patent application, Serial No. 35,336, Joseph Moyson, filed June 10, 1960, entitled, "Semi-conductor Devices and Methods of Making Same," and assigned to the assignee of the present invention provides switching devices of the kind described in which better control current sensitivity and better temperature stability are concurrently obtained. In that application, these results are achieved by providing a separate emitter region for the device gate electrode so that it makes minority carrier injecting contact with its associated intermediate region of the four layer switch. However, even with the improvements taught by Moyson, the device plate firing characteristics are not entirely independent of temperature. That is, the current and voltage at which the device switches between its high and low impedance states may vary with temperature.

Accordingly, it is an object of the present invention to provide semiconductor devices of improved characteristics.

It is another object of the present invention to provide semiconductor devices of the switch-type which have gate firing characteristics that are highly independent of temperature variations.

In carrying out the present invention in one illustrative form, a body of semiconductor material including four layers of one and the opposite conductivity are provided. The layers of one conductivity type are interleaved with layers of the opposite conductivity type to form three P-N junctions. One main electrode is provided making low resistance ohmic contact with a surface of an external layer of said body and in a preferred arrangement also making ohmic contact with an exposed surface of an adjacent intermediate layer. Another main electrode is provided making low resistance ohmic contact with a surface of the other external layer of said body. A third (gate) electrode is provided making minority carrier injecting contact with the aforementioned adjacent intermediate layer and cooperatively associated with the innermost junction to provide transistor action therewith. The third electrode is cooperatively associated with the one electrode, thereby enabling the center P-N junction adjacent the third electrode to be rendered conductive with minimal applied control current, thus initiating a sequential action by which the center P-N junction becomes conductive over its entire extent. A heavily doped zone of the one or the opposite conductivity type is provided at the junction of the control electrode to form a localized tunnel junction with said central zone.

Further objects and advantages of the present invention will be more clearly understood by reference to the following description taken in connection with the accompanying drawing and its scope will be apparent in the appended claims.

Figure 1:
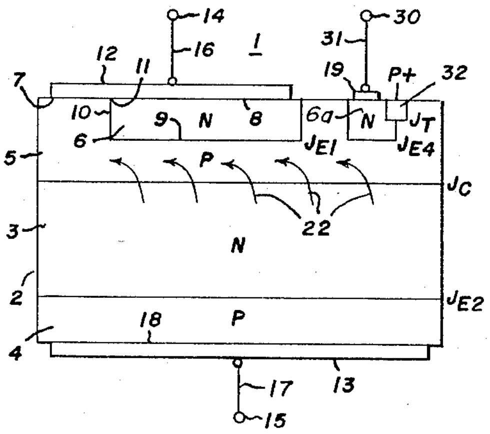
FIGURES 1 and 4 show sectional views of four-layer three-electrode switching devices in accordance with the present invention.

Referring now in particular to FIGURE 1, there is shown a cross-sectional view of an illustrative embodiment of the present invention. FIGURE 1 shows a semiconductor device 1 comprising a body of semiconductor material 2 having four layers or regions therein, an N-type conductivity intermediate region 3, a P-type conductivity external region 4, a P-type conductivity intermediate region 5 adjacent thereto, and an N-type conductivity external region 6 adjacent the P-type intermediate region 5. These regions meet to form three generally parallel P-N junctions, $J_C$, $J_{E1}$ and $J_{E2}$. $J_C$ is referred to as the collector or center junction and is formed between the N-type region 3 and the P-type region 5. $J_{E1}$ is referred to as the first emitter junction and is formed between the P-type layer 5 and N-type layer 6. $J_{E2}$ is referred to as the second emitter junction and is formed between N-type layer 3 and P-type layer 4. The intermediate P-type region 5 surrounds the N-type region 6 on two sides and as illustrated, has a surface 7 coplanar with the outside surface 8 of region 6. As shown, junction $J_{E1}$ has a substantial portion generally parallel to a surface 8 and a portioin of lesser extent 10 generally perpendicular to and meeting with external surfaces 7 and 8 of regions 5 and 6, respectively. The body 2 has a pair of opposed surfaces generally parallel to the collector junction $J_C$. One opposed surface 18 comprises the external surface of the P-type region 4 and the other comprises the external surface 8 of the N-type region 6 and external surface 7 of intermediate P-type region 5 coplanar therewith.

A conductive electrode 12 is secured in good conductive contact with the external surfaces 7 and 8 and another conductive electrode 13 is secured in good conductive contact to the external surface 18. Electrode 12 spans and short circuit junction $J_{E1}$ along a line whose projection perpendicular to the plane of the drawing is point 11. Electrodes 12 and 13 are connected to external cathode and anode terminals 14 and 15, respectively by leads 16 and 17, respectively.

A minority carrier injecting region **6*a* (a region of N-type conductivity which is referred to as the gate emitter region) is provided in the layer 5 which extends out to the top surface of the device on that side of the junction $J_{E1}$ which is remote from the part of $J_{E1}$ which is short circuited and forms $J_{E4}$. A gate or triggering electrode 19 is connected to region 6*a*. The gate electrode 19 is connected to a gate terminal 30 by means of lead 31**.

Region **6*a* is of smaller extent than region 6 and forms with P-type regions 4 and 5 and N-type region 3 another four-layer three-electrode switching device with electrodes 12 and 13 being the external electrodes therefor. The region 6*a* may be differently formed than region 6, i.e. it may be more heavily N-type conductivity and it may be more closely spaced to $J_C$ than $J_{E1}$ and thus could be made appreciably more efficient as an emitter than region 6 and require only small triggering currents to render the device conductive between electrodes 12 and 13**.

In accordance with the present invention, the gate current required to switch the device between high and low impedance states is rendered substantially independent of temperature variations by providing a tunnel junction astride at least a portion of the gate junction $J_{E4}$. Thus, for low gate currents the tunel junction is effectively in shunt with gate PNPN device. In the embodiment of FIGURE 1, this is accomplished by providing a region 32 of heavily doped P type material which forms tunnel junction $J_T$ with the N type conductivity zone or region **6*a* and effectively an ohmic contact with adjacent internal P type region 5. Region 32 is formed in this embodiment by a dot of an alloy composed of aluminum, silicon, boron, and silver although other means of forming tunnel junctions are well known in the art and readily available. The tunnel junction can be formed all the way around the surface of gate emitter region 6*a*** and, if desired, selectively etched away.

Although the tunnel junction is quite well known, perhaps it should be defined here along with some other terms used. For purposes of this description, a tunnel junction exists between two juxtaposed regions of opposite conductivity type in a body of semiconductor material when the regions are so heavily impregnated with activators or conductivity type determining impurities as to render at least one of the regions degenerate and the other approximately so, and the transition in impregnation sufficiently abrupt to prove narrow space charge in the regions adjacent the junction.

Degenerate, as applied to semiconductor material, designates material in which the Fermi-level lies either in the conduction or valence band on the energy band diagram of such material, depending on whether the material is N-type or P-type in conductivity. The concentration of donor or acceptor impurity necessary to render a semiconductive material degenerate depends on the particular semiconductive material. For example, the impurity concentration required to render silicon degenerate at room temperature is about $1\times-10^{19}$ atoms per cubic centimeter, depending to some degree upon the particular impurity material utilized.

Narrow, as applied to the width of the space charge region, designates an order of magnitude sufficiently small such that at low voltages current flow thereafter is determined essentially by the quantum mechanical tunnelling of electrons. The width of the P-N junction space charge region separating two regions of different conductivity type semiconductive material depends upon various factors as, for example, the particular semiconductive material and the concentration of donor and acceptor impurity in the respective regions thereof. For example, the P-N junction space charge region formed between a region of degenerate P-type and a region of degenerate N-type conductivity silicon is usually less than about 200 angstrom units wide.

When one or both regions of a tunnel junction device are only approximately degenerate, the device may exhibit only a weak negative resistance region or none at all. Further details on tunnel junctions per se may be had by reference to any of a number of publication on this subject, for example, volume ED–7, No. 1, January 1960, of the IRE Transactions of the Professional Group on Electron Devices, R. N. Hall, "Tunnel Diodes" or an article entitled "Germanium and Silicon Tunnel Diodes—Design, Operation and Application" by Lesk, Holonyak, Davidsohn and Aarons, appearing in the 1959 IRE Wescon Convention Record, Part 3, ECG–441.

Figure 2:
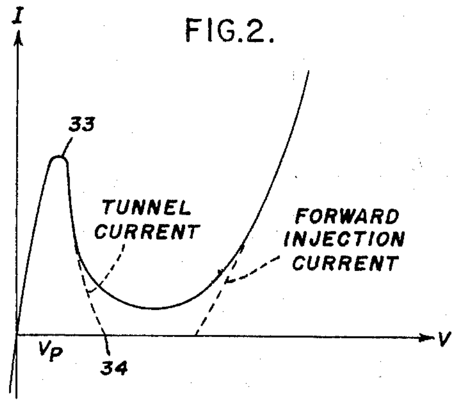
FIGURE 2 shows a graph of the current versus voltage characteristic of a tunnel junction useful in explaining the operation of the device of FIGURE 1.

The current versus voltage characteristics of a tunnel junction structure such as formed by regions **6*a* and 32 of FIGURE 1 is illustrated in FIGURE 2. Applying either a forward or a reverse voltage across the junction will cause the quantum mechanical tunneling current so designated on the graph to increase rapidly with increasing small applied voltages. In the forward direction, tunneling current reaches at maximum at 33 and thereafter falls to point 34. With still greater voltage normal injection current becomes noticeable at point 34** and increases until it predominates at higher voltages. The composite of the two currents is the current shown in the solid line in this figure.

The manner in which the tunnel junction and its characteristics are utilized in the device of FIGURE 1 will be explained in connection with FIGURE 3. In the graph, the current flow between the electrodes 12 and 13 is represented as the ordinate and the voltage applied across the electrodes is represented as the abscissa. Assume that an increasing voltage is applied between electrodes 12 and 13 so as to render electrode 12 increasingly positive with respect to electrode 13. Junction $J_{E1}$ tends to become and junction $J_{E2}$ becomes reversely biased. Thus, both of these junctions are in a blocking state. The collector junction $J_C$ is forwardly biased. Thus, a high impedance is presented across electrodes 12 and 13 until avalanche breakdown voltage of the emitter junction $J_{E2}$ is reached corresponding to voltage represented by abscissa 35 on the graph of FIGURE 3.

Assume that an increasing voltage is applied between electrodes 12 and 13 to render electrode 12 increasingly negative with respect to electrode 13. With such voltage applied, junctions $J_{E1}$ and $J_{E2}$ become forward biased and junction $J_C$ becomes reversely biased. At low currents emitter junction $J_{E1}$ is practically inoperative as an emitter because of the shorting of the regions 5 and 6 by electrode 12. However, current flow develops a bias along upper emitter junction $J_{E1}$. As the voltage across the device increases, only a small saturation current flows representing reverse current across junction $J_C$ shown as point 36 on the ordinate of the graph of FIGURE 3. As the voltage approaches the avalanche voltage VBO of collector junction $J_C$, the current flow across junction $J_C$ represented by arrows 22 is parallel to the emitter junction $J_{E1}$ toward the surface 7 and increases rapidly. The resulting voltage drop produced by this current flow in region 5 along junction $J_{E1}$ with the largest bias occurring at the right-hand edge of the junction farthest from the shorting contact 11. The effective emitter efficiency and hence alpha increases rapidly with increased current flow. When the current reaches a level $I_s$, referred to as turn-on current, the alpha sum of the NPN and the PNP transistor sections of the device is greater than unity, the device switches to the low voltage state (a low impedance state). The low voltage state is indicated at point 38 on the abscissa of the graph of FIGURE 3.

The transition from high impedance to low impedance state is very abrupt for the reason that as the voltage across collector junction $J_C$ drops, the current originally distributed over the entire region 5 now shifts mainly to the edge of region 6 remote from portion 10 and the current density becomes very high. The device switches to the low voltage state at a still higher current level at which the alpha sum requirement is met. Once the switch is on, sufficient biasing of the base region must be maintained to hold the emitter in strong forward bias. Since $J_C$ is now in forward bias, avalanche effects of $J_C$ no longer are significant in maintaining conduction of the device.

Figure 3:
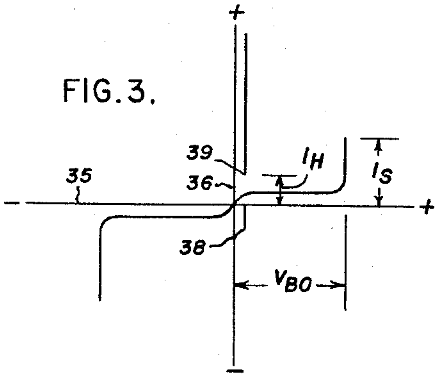
FIGURE 3 is a graph of the current between main electrodes 12 and 13 versus voltage characteristic of the device of FIGURE 1.

When external circuit requirements are such that the current $I_h$ in FIGURE 3 is less than the minimum value necessary to maintain the device in conduction as represented by ordinate 39, the device ceases to conduct and reverts to its high impedance (non-conductive) state. In the region of heavy forward conduction, most of the emitter is biased into conduction and the device exhibits the low impedance characteristic of conventional PNPN switch devices.

With respect to the characteristics shown in FIGURE 3, it has been found possible to vary the value of the switch-on current $I_s$ to be greater than, equal to, or less than the hold current $I_h$, as explained in the Holonyak and Aldrich patent application, supra. Thus, with proper design (as taught) the cathode to anode (14 to 15) portion of the device is made to have a high temperature capability without turning on.

The gate firing characteristic is also made insensitive to temperature variations by inclusion of the tunnel junction region 32 between a portion of gate emitter region **6*a* and the adjacent internal region 5**. This is possible since the tunnel junction $J_T$ peak current $I_P$ is virtually independent of temperature. The turn-on current can be precisely set by setting the tunnel junction peak current.

In order to understand how the tunnel junction renders the device firing characteristic independent of temperature, it is necessary to understand gate firing of the device (in this case, junction gate firing). Assume main electrode 13 positive relative to main electrode 12. Thus, the emitter junctions $J_{E1}$ and $J_{E2}$ are forward biased and center junction $J_C$ is reverse biased before the device is fired. To gate fire the device, current is removed from gate lead 31 by rendering gate electrode 19 negative relative to main electrode 12. Thus, gate emitter junction $J_{E4}$ is forward biased and upper emitter junction $J_{E1}$ reverse biased (in the circuit between main electrode 12 and gate electrode 19). During this phase of triggering, only gate PNPN structure (viz. lower P-type emitter region 4, internal N-type region 3, upper internal P-type region 5 and gate emitter **6*a*) is considered. Base current drive for this PNPN structure is supplied from main electrode 12**.

As the voltage between main electrode 12 and gate electrode 19 increases, the base current drive for the gate PNPN is increased causing the gate emitter current to increase through the gate PNPN portion of the device. As previously explained, increase of emitter current causes the alphas to increase and the gate PNPN to start switching. When this switching begins, the voltage across center junction $J_C$ (reverse biased) starts to collapse causing increased emitter currents across both emitter junctions $J_{E1}$ and $J_{E2}$. Once these emitter currents have increased to the point where the alphas approach unity, the previously described base drive current from main electrode 12 toward gate electrode 19 reverses because more than enough current is supplied from lower main electrode 13. When this base drive current reverses, it starts driving the base of the PNPN switch between main electrodes and directly under the edge of upper emitter region 6. With this base drive current, the main body of the device switches on.

Since the gate PNPN structure must begin switching before the main device can be switched on (in the gate firing mode) the device turn-on characteristics are dependent upon the gate PNPN structure. Since the gate PNPN structure includes the tunnel junction $J_T$ in shunt with its emitter junction $J_{E4}$, for low current levels essentially all gate current flows through the low impedance tunnel junction $J_T$. This includes all the gate current; both that thermally generated and collected plus that flowing cathode terminal to gate. When gate current through the tunnel junction $J_T$ reaches the peak tunnel current $I_P$ the voltage across the junction $J_T$ increases and the current decreases resulting in the gate emitter junction $J_{E4}$ sharing the gate current. The gate PNPN then starts to switch on which starts the total device switching on. Thus, the gate current required to trigger the switch becomes equal to that required to switch the tunnel diode. Since the peak current $I_P$ of the tunnel diode is independent of temperature, the device firing current then becomes independent of temperature.

The device shown in FIGURE 1 may be constructed by any of a variety of techniques. By one such technique, the pellet is made starting with silicon of N conductivity type having a resistivity of 10 to 30 ohm-centimeters (impurity concentration of about $2.5\times(10)^{14}$ atoms/cc.) that ultimately forms the internal N type layer 3. The initial pellet is rectangular with dimensions of 100 mils by 70 mils and has a thickness of approximately 8.5 mils. The pellet is gallium diffused to a depth of about 2.2 mils so that P conductivity layers are formed on both sides of the N type layer. The P type layer on one side ultimately forms part of the internal P type base layer 5, and the other P type layer so formed ultimately forms the lower P type emitter layer 4. The internal P type base layer is the layer in which upper N type cathode emitter 6 and gate emitter **6*a*** are ultimately formed.

To complete the pellet of FIGURE 1, it is masked on both sides with, for example, silicon dioxide. A portion of the oxide mask is removed from the upper major face of the pellet to exposed a portion of the P type layer 5 for cathode emitter 6 which is about 40 mils by 70 mils and displaced 10 mils from one side. About 10 mils from the cathode emitter area, another strip is exposed for the gate emitter *6a* which strip is approximately 20 mils by 70 mils. The pellet is phosphorous diffused to a depth of approximately 1.1 mils to form the N conductivity type emitters 6 and *6a*. The oxide masking is then removed, the region 32 is alloyed in as previously described and appropriate contacts are formed by conventional means.

The gate emitter-base tunnel characteristic may be controlled by etching as well as by controlling the initial impurity profiles of either or both the gate emitter region 32 and internal base region 5.

Figure 4:
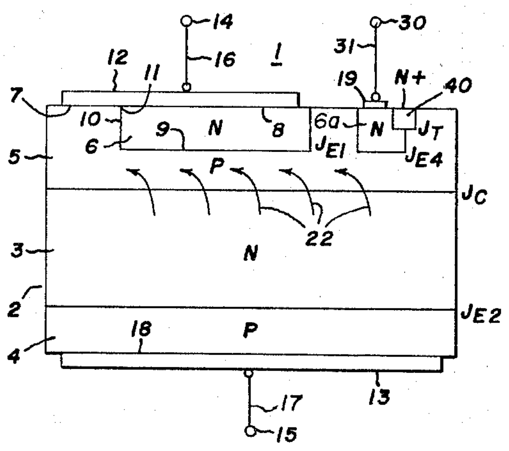

In FIGURE 4 is shown a four-layer three-electrode switching device similar to the device of FIGURE 1 and corresponding elements are denoted by the same reference characters. The difference between the two devices is that the P type tunnel region 32 of the device of FIGURE 1 is replaced by a highly doped N type region 40. Thus, the N type region 40 in effect forms an ohmic contact with the N type gate emitter region *6a* and a tunnel junction with the P type internal base region 5. Thus, the tunnel junction $J_T$ is again in parallel with the gate PNPN and consequently exerts the same temperature stabilizing effect on gate trigger characteristics as does region 32 of the device of FIGURE 1.

It will be appreciated that the same principles apply regardless of the method of device fabrication. The same principles also apply to duals of the device of FIGURES 1 and 4. The term "dual" is used here to indicate devices of the same structure but with opposite conductivity types substituted in each region.

While particular embodiments of the invention have been shown and described it will, of course, be understood that the invention is not limited thereto since many modifications varied to fit particular operating requirements and environments will be apparent to those skilled in the art. The peculiar properties of the invention may be taken advantage of in other semiconductor devices utilizing other materials than those described without departing from the concept of the invention. Accordingly, the invention is not considered limited to the examples chosen for the purposes of disclosure and it is contemplated that the appended claims will cover any such modifications as fall within the true spirit and scope of the invention.

What I claim as new and desire to secure by Letters Patent of the United States is:

1. A semiconductor switching device including in combination,

A. a body of semiconductor material having
   a. four regions of one and the opposite conductivity type interleaved to define three pn junctions therebetween, B. a pair of main current carrying electrodes each in low resistance ohmic contact with one of the external regions of said four regions whereby a current path is provided through said four regions between said pair of main current carrying electrodes, C. a gate emitter region formed in one of said internal regions of said body of semiconductor material and having the opposite type conductivity from that adjacent internal region, D. a third electrode in low resistance ohmic contact with said gate emitter region thereby to provide a gate electrode for supplying gate firing current to the semiconductor switching device and E. a highly doped region of the same conductivity as the said adjacent internal region formed straddling a portion of the junction between said gate emitter region and said adjacent internal region thereby to form a tunnel junction with said gate emitter region and reduce sensitivity of gate firing current to temperature variations.

2. In a semiconductor switch

A. a body of semiconductor material having four regions of alternate conductivity types separated by three rectifying junctions, B. a pair of main current carrying electrodes each in low resistance ohmic connections to each terminal region whereby a main current path is provided through said four regions between said pair of main current carrying electrodes,
   a. one of said main current carrying electrodes also contacting the adjacent internal region, C. a gate emitter region formed in the said adjacent internal region and having the opposite type conductivity from said adjacent internal region, D. a third electrode in low resistance ohmic contact with said gate emitter region thereby to provide a gate electrode for supplying gate firing current to the semiconductor switching device and E. a highly doped region of the same conductivity as the said adjacent internal region formed straddling a portion of the junction therebetween said gate emitter region and said adjacent internal region thereby to form a tunnel junction with said gate emitter region and reduce sensitivity of gate firing current to temperature variations.

3. A semiconductor switching device including in combination,

A. a body of semiconductor material having
   a. four regions of one and the opposite conductivity type interleaved to define three pn junctions therebetween, B. a pair of main current carrying electrodes each in low resistance ohmic contact with one of the external regions of said four regions whereby a current path is provided through said four regions between said pair of main current carrying electrodes, C. a gate emitter region of n conductivity type formed in an internal region of p conductivity type, D. a third electrode in low resistance ohmic contact with said gate emitter region thereby to provide a gate electrode for supplying gate current to the semiconductor switching device and E. a highly doped region of p type conductivity formed straddling a portion of the junction between said gate emitter region and said adjacent internal region thereby to form a tunnel junction with said gate emitter region and to reduce sensitivity of gate firing to device temperature variations.

4. A semiconductor switching device including in combination,

A. a body of semiconductor material having
   a. four regions of one and the opposite conductivity type interleaved to define three pn junctions therebetween, B. a pair of main current carrying electrodes each in low resistance ohmic contact with one of the external regions of said four regions whereby a current path is provided through said four regions between said pair of main current carrying electrodes,
   a. the one of said main current carrying electrode which contacts an external n conductivity type region also contacting the adjacent p type internal region, C. a gate emitter region of n conductivity type formed in an internal region of p conductivity type, D. a third electrode in low resistance ohmic contact with said gate emitter region thereby to provide a gate electrode for supplying gate current to the semiconductor switching device and E. a highly doped region of p-type conductivity formed straddling a portion of the junction between said gate emitter region and said adjacent internal region thereby to form a tunnel junction with said gate emitter region and to reduce sensitivity of gate firing to device temperature variations.

5. A semiconductor switching device including in combination,

A. a body of semiconductor material having
 a. four regions of one and the opposite conductivity type interleaved to define three pn junctions therebetween, B. a pair of main current carrying electrodes each in low resistance ohmic contact with one of the external regions of said four regions whereby a current path is provided through said four regions between said pair of main current carrying electrodes, C. a gate emitter region formed in one of said internal regions of said body of semiconductor material and having the opposite type conductivity from that adjacent internal region, D. a third electrode in low resistance ohmic contact with said gate emitter region thereby to provide a gate electrode for supplying gate firing current to the semiconductor switching device and E. a highly doped region formed straddling a portion of the junction between said gate emitter region and said adjacent internal region thereby to form a tunnel junction therebetween and reduce sensitivity of gate firing current to temperature variations.

6. In a semiconductor switch

A. a body of semiconductor material having four regions of alternate conductivity types separated by three rectifying junctions, B. a pair of main current carrying electrodes each in low resistance ohmic connections to each terminal region whereby a main current path is provided through said four regions between said pair of main current carrying electrodes,
 a. one of said main current carrying electrodes also contacting the adjacent internal region, C. a gate emitter region formed in the said adjacent internal region and having the opposite type conductivity from said adjacent internal region, D. a third electrode in low resistance ohmic contact with said gate emitter region thereby to provide a gate electrode for supplying gate firing current to the semiconductor switching device and E. a highly doped region formed straddling a portion of the junction between said gate emitter region and said adjacent internal region thereby to form a tunnel junction therebetween and reduce sensitivity of gate firing current to temperature variations.

7. A semiconductor switching device including in combination,

A. a body of semiconductor material having
 a. four regions of one and the opposite conductivity type interleaved to define three pn junctions therebetween, B. a pair of main current carrying electrodes each in low resistance ohmic contact with one of the external regions of said four regions whereby a current path is provided through said four regions between said pair of main current carrying electrodes, C. a gate emitter region formed in one of said internal regions of said body of semiconductor material and having the opposite type conductivity from that adjacent internal region, D. a third electrode in low resistance ohmic contact with said gate emitter region thereby to provide a gate electrode for supplying gate firing current to the semiconductor switching device and E. a highly doped region of the same conductivity as the said gate emitter region formed straddling a portion of the junction between said gate emitter region and said adjacent internal region thereby to form a tunnel junction with said gate emitter region and reduce sensitivity of gate firing current to temperature variations.

8. In a semiconductor switch

A. a body of semiconductor material having four regions of alternate conductivity types separated by three rectifying junctions, B. a pair of main current carrying electrodes each in low resistance ohmic connections to each terminal region whereby a main current path is provided through said four regions between said pair of main current carrying electrodes,
 a. one of said main current carrying electrodes also contacting the adjacent internal region, C. a gate emitter region formed in the said adjacent internal region and having the opposite type conductivity from said adjacent internal region, D. a third electrode in low resistance ohmic contact with said gate emitter region thereby to provide a gate electrode for supplying gate firing current to the semiconductor switching device and E. a highly doped region of the same conductivity as the said gate emitter region formed straddling a portion of the junction therebetween said gate emitter region and said adjacent internal region thereby to form a tunnel junction with said gate emitter region and reduce sensitivity of gate firing current to temperature variations.

References Cited by the Examiner

UNITED STATES PATENTS

| | | | |
|---|---|---|---|
| 2,962,605 | 11/1960 | Grosvalet | 307—88.5 |
| 3,079,512 | 2/1963 | Rutz | 317—235 |
| 3,124,703 | 3/1964 | Sylvan | 317—234 |
| 3,176,147 | 3/1965 | Miller | 317—235 |
| 3,196,330 | 7/1965 | Moyson | 317—235 |

FOREIGN PATENTS 1,303,035 7/1962 France.

References Cited by the Applicant

UNITED STATES PATENTS

| | | |
|---|---|---|
| 2,875,505 | 3/1959 | Pfann. |
| 2,939,056 | 5/1960 | Muller. |
| 2,971,139 | 2/1961 | Noyce. |
| 2,980,810 | 4/1961 | Goldey. |
| 2,985,804 | 5/1961 | Buie. |
| 2,993,154 | 7/1961 | Goldey et al. |
| 3,046,459 | 7/1962 | Anderson et al. |

OTHER REFERENCES

I.B.M. Technical Disclosure Bulletin, Switching Device, volume 2, No. 3, October 1959.

Bulletin D420-02-8-59, page 14, Solid State Products, Inc., Salem, Massachusetts.

JOHN W. HUCKERT, *Primary Examiner.*

J. D. CRAIG, *Assistant Examiner.*